United States Patent
Kang et al.

(10) Patent No.: US 7,057,966 B2
(45) Date of Patent: Jun. 6, 2006

(54) SEMICONDUCTOR MEMORY DEVICE FOR REDUCING CURRENT CONSUMPTION IN OPERATION

(75) Inventors: Shin-Deok Kang, Ichon-shi (KR); Ki-Chang Kwean, Ichon-shi (KR)

(73) Assignee: Hynix Semiconductor Inc., Kyoungki-do (JP)

( * ) Notice: Subject to any disclaimer, the term of this patent is extended or adjusted under 35 U.S.C. 154(b) by 0 days.

(21) Appl. No.: 10/998,678

(22) Filed: Nov. 30, 2004

(65) Prior Publication Data
US 2005/0140969 A1   Jun. 30, 2005

(30) Foreign Application Priority Data
Dec. 30, 2003   (KR) .................. 10-2003-0099905

(51) Int. Cl.
*G11C 8/00* (2006.01)
(52) U.S. Cl. .................. 365/233; 365/230.01
(58) Field of Classification Search ............... 365/233, 365/230.01
See application file for complete search history.

(56) References Cited

U.S. PATENT DOCUMENTS

| 6,636,446 B1 * | 10/2003 | Lee et al. .................. 365/194 |
| 6,671,788 B1 * | 12/2003 | Shinozaki .................. 711/167 |
| 2002/0110037 A1 * | 8/2002 | Fukuyama ............. 365/230.03 |

FOREIGN PATENT DOCUMENTS

KR   10-2000-0052588 A   8/2000

\* cited by examiner

*Primary Examiner*—Michael Tran
(74) *Attorney, Agent, or Firm*—McDermott Will & Emery LLP

(57) ABSTRACT

A synchronous memory device can reduce unnecessary current consumption in its operation. In the synchronous memory device, a clock receiver receives an external clock to output a first internal clock. An address latch unit receives and latches an address in synchronous with the first internal clock. A row address latch unit latches a row address that is outputted from the address latch unit. A column address control unit receives the first internal clock to output a second internal clock and stops the output of the second internal clock when a non-column command is performed. Finally, a column address control unit is activated in response to the second internal clock to count a column address that is outputted from the address latch unit so as to output an inner column address.

5 Claims, 3 Drawing Sheets

| all_bank_idle | clk | clk_int |
|---|---|---|
| 0 | 0 | 0 |
| 0 | 1 | 1 |
| 1 | 0 | 0(disable) |
| 1 | 1 | 0(disable) |

SEMICONDUCTOR MEMORY DEVICE FOR REDUCING CURRENT CONSUMPTION IN OPERATION

FIELD OF INVENTION

The present invention relates to a semiconductor memory device; and, more particularly, to a semiconductor memory device capable of reducing current consumption in its operation.

DESCRIPTION OF PRIOR ART

A semiconductor memory device has been continuously improved to increase its operational speed with increased integration. There has been introduced, so called, a synchronous memory device which operates in synchronous with an external clock signal, so as to improve the operational speed of the semiconductor memory device.

The synchronous semiconductor memory device performs a data access operation at the rising edge of the external clock signal. That is, the synchronous semiconductor memory device can perform the data access operation once within one cycle of the external clock signal. Such a synchronous semiconductor memory device that performs the data access operation once within one cycle of the external clock signal is particularly called a single data rate (SDR) synchronous semiconductor memory device.

However, the SDR synchronous semiconductor memory device had to be more improved for use in a high-speed system. Therefore, a double data rate (DDR) synchronous semiconductor memory device has been developed, which processes data twice within one cycle of the external clock signal.

The DDR synchronous semiconductor memory device performs the data access operation through its respective data input/output pins at the rising edge and the falling edge of the external clock signal in succession. Accordingly, the DDR synchronous semiconductor memory device can operate in a higher speed without increasing the frequency of the clock signal, since it can get at least two times of bandwidth compared with the SDR synchronous semiconductor memory device.

On the other hand, the synchronous semiconductor memory device operating in synchronous with the external clock signal requires a clock receiver circuit for transferring the external clock signal as an internal clock signal. All the blocks in the device operate in synchronous with the internal clock signal from the clock receiver circuit.

Accordingly, all the blocks in the synchronous semiconductor memory device are stayed in disable-state until the clocked internal clock signal is inputted.

FIG. 1 shows a block diagram of a conventional semiconductor memory device.

Referring to FIG. 1, the conventional semiconductor memory device includes an address receiver 10 for receiving an address A<0:13> to transfer it to the internal parts of the memory device, a clock receiver 20 enabled with a clock enable signal CKE for receiving a clock CK to output an internal clock clk, an address latch unit 30 for latching the address A2<0:13>, that is received from the address receiver 10, in synchronous with the clock signal, a row address latch unit 40 for receiving the latched address A3<0:13> when the latched address A3<0:13> is a row address to transfer the latched address as an inner row address Row<0:12>, and a column address control unit 50 for counting the latched address A3<0:13> to output an inner column address Col<0:9> when the latched address A3<0:13> is a column address.

The column address control unit 50 receives a number of bits (here, for example, 10 bits) corresponding to the column address among the latched address A3<0:13> and counts and delays the received address depending on column address strobe (CAS) latency and additive latency so as to output the inner column address Col<0:9>.

The CAS latency (CL) means the number of clocks which are spent to output data after input of a read command or a write command in the synchronous memory device. The additive latency means time from the input of the read command or the write command to the actual operation corresponding to read or write command, after an active command is inputted to get to an active state.

The memory device commonly receives the column address and the row address by using a single address path, which receives the row address along with the active command and the read or write command along with the column address. Here, the row address has 14 bits and the column address has 10 bits.

It will be described for the operation of the conventional synchronous memory device with reference to FIG. 1.

First, there are three operation states in the synchronous memory device, which are the active state, a read or write command state, and a pre-charge state. In the active state, the active command and the row address are inputted. In the read or write command state, the read or write command and the column address are inputted for data access. In the pre-charge state, a pre-charge command is inputted to perform a pre-charge operation after the data access.

Further, there are a power-down mode and a stand-by mode in which no external command is inputted. In the power-down mode, no inner operation is performed to maintain minimum power consumption. In the stand-by mode, a series of inner preparing operations are performed to receive the command and the address and some current is consumed.

First, it will be described for the power-down mode. When the clock enable signal CKE is inputted in the inactive state, the synchronous memory device goes to the power-down mode so as to perform no inner operation. Since the clock receiver 20 is activated by the clock enable signal CKE, the clock receiver 20 maintains its state in the disable state during the power-down mode so that it does not output the internal clock clk even when the clock signal is inputted. Accordingly, the internal clock clk is not inputted during the power-down mode so as to put all the inner blocks 30, 40, 50 in the synchronous memory device in the disable state.

When the clock enable signal CKE is inputted in active, the power-down mode is released and the memory device starts its operation. From then, the clock receiver 20 outputs the internal clock.

After the power-down mode is released, it goes to the stand-by mode, or an external active command can be inputted immediately.

When the active command is inputted, its corresponding row address is inputted. At this time, when the address receiver 10 receives and transfers the inputted row address, the address latch unit 30 latches it in synchronous with the internal clock clk. Then, the row address latch unit 40 receives the latched address A3<0:13> to output the inner row address Row<0:13> for selecting a word line (not shown) of the memory cell array.

Then, when the read or write command is inputted, the column address is inputted to the address receiver 10. The inputted column address is outputted to the address latch unit 30 through the address receiver 10. The address latch unit 30 latches the inputted column address in synchronous with the internal clock clk. Then, the column address control unit 50 receives and counts the latched column address A3<0:13>, e.g., a 10-bit signal, in synchronous with the internal clock clk to output the inner column address Col<0:9>.

Based on the inner column address Col<0:9>, the bit line (not shown) of the memory cell array is selected. The unit cell to be accessed is selected depending on the word line that is selected by the inner row address Row<0:13> and the bit line that is selected by the inner column address Col<0:9>. If the read command, data in the selected unit cell is outputted to an external device and, if the write command, data from an external device is stored in the selected unit cell.

Then, when the pre-charge command is inputted, the inner circuit that is activated by the active command and the read/write command is initialized.

If the active command for data access is not inputted for the time being, the memory device goes to the stand-by state in which the inner circuit operates normally waiting for the input of the command as described above.

That is, the clock receiver 20 outputs the internal clock clk to the inner blocks and the inner blocks are operated upon the input of the internal clock clk.

However, while the row address-related block 40 should be in waiting because the active command and the row address are inputted after the stand-by mode, the column address-related block 50 does not have to be in waiting.

Because the read or write command is inputted only after the active command is inputted, the column address does not have to be in waiting during the stand-by mode.

In the conventional memory device, the internal clock clk is inputted to the column address control unit 50 in the stand-by mode, which makes the column address control unit 50 maintain the enable state. Consequently, this can leads unnecessary current consumption.

SUMMARY OF INVENTION

It is, therefore, an object of the present invention to provide a synchronous memory device for reducing unnecessary current consumption in its operation.

In accordance with an aspect of the present invention, there is provided a synchronous memory device including: a clock receiver for receiving an external clock to output a first internal clock; an address latch unit for receiving and latching an address in synchronous with the first internal clock; a row address latch unit for latching a row address that is outputted from the address latch unit; a column address control unit for receiving the first internal clock to output a second internal clock and stopping the output of the second internal clock when a non-column command is performed; and a column address control unit activated in response to the second internal clock for counting a column address that is outputted from the address latch unit to output an inner column address.

In accordance with another aspect of the present invention, there is provided a synchronous memory device including: a clock receiver for receiving an external clock to output a first internal clock and a second internal clock and stopping the output of the second internal clock when a non-column command is performed; an address latch unit for receiving and latching an address in synchronous with the first internal clock; a row address latch unit for latching a row address that is outputted from the address latch unit; a column address control unit activated in response to the second internal clock for counting a column address that is outputted from the address latch unit to output an inner column address.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a data output control circuit for use in a semiconductor memory device in accordance with the present invention will be described in detail referring to the accompanying drawings.

Figure 1:
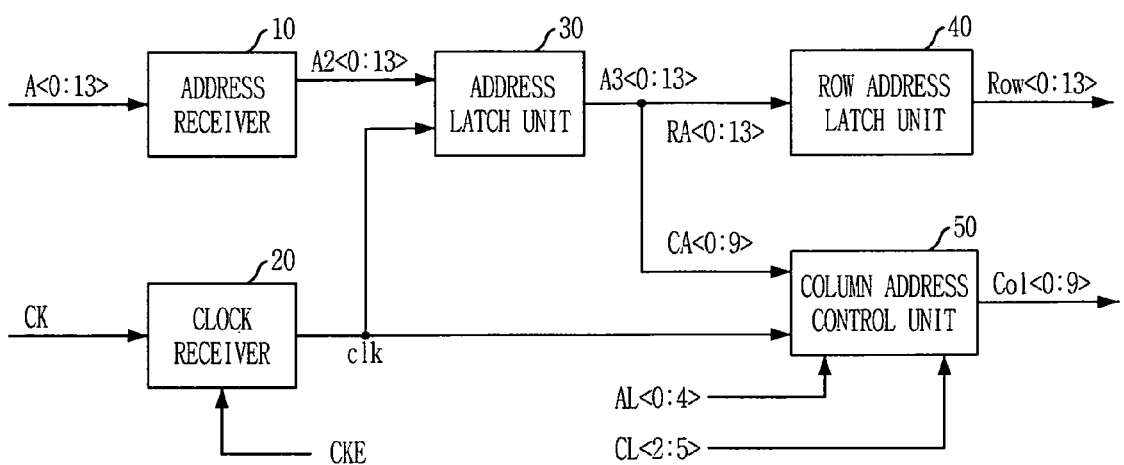
FIG. 1 shows a block diagram of a conventional semiconductor memory device.
Figure 2:
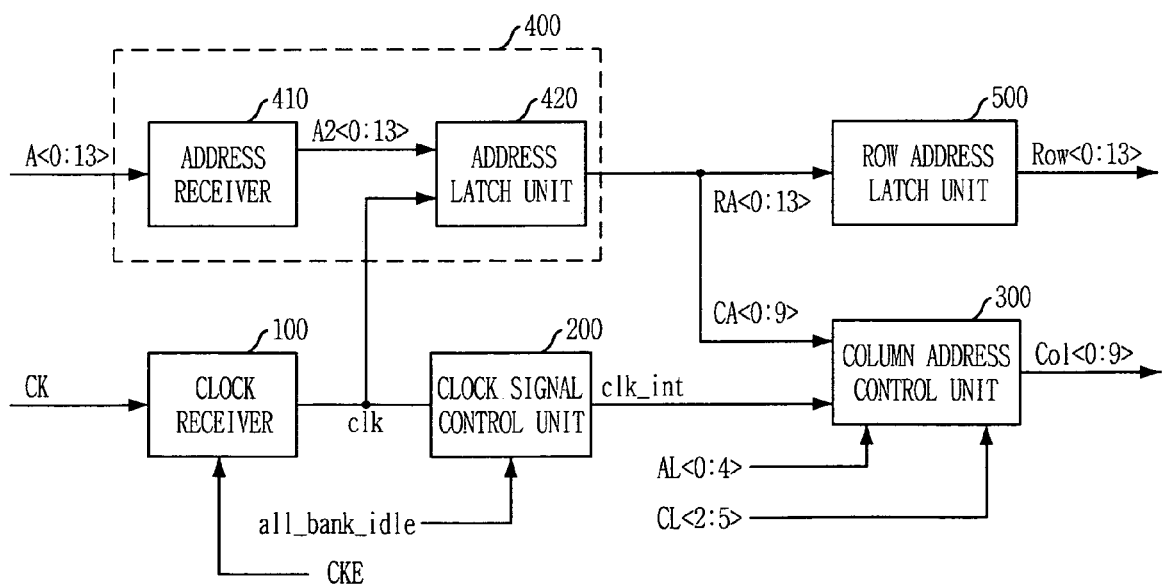
FIG. 2 provides a block diagram of a semiconductor memory device in accordance with a preferred embodiment of the present invention.

FIG. 2 provides a block diagram of a semiconductor memory device in accordance with a preferred embodiment of the present invention.

Referring to FIG. 2, the synchronous memory device of the embodiment includes a clock receiver 100 for receiving an external clock CK to output a first internal clock clk; an address receiver 410 for receiving and transferring an address A<0:13>; an address latch unit 420 for latching the address A2<0:13> that is transferred by the address receiver 410, in synchronous with the first internal clock clk; a row address latch unit 500 for latching a row address RA<0:13> that is outputted from the address latch unit 420 to output an inner row address Row<0:13>; a column address control unit 200 for buffering the first internal clock clk to output a second internal clock clk_int and stopping the output of the second internal clock clk_int in a stand-by mode; and a column address control unit 300 activated in response to the second internal clock clk_int for counting a column address CA<0:9> that is outputted from the address latch unit 420 to output an inner column address Col<0:9>. Here, the column address control unit 200 stops the output of the second internal clock clock_int in response to a control signal all_bank_idle that gets high when all the banks are idle, i.e., no bank is in active.

Figures 3, 4:
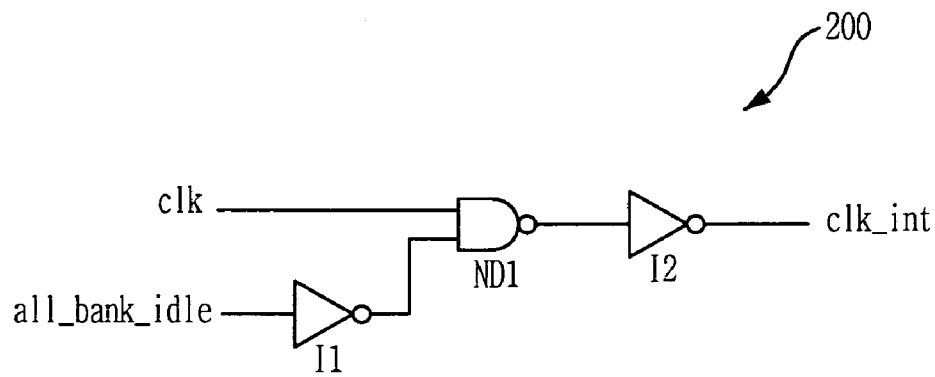
FIG. 3 offers a circuit diagram for a column address control unit shown in FIG. 2.
FIG. 4 represents a truth table for operation of the column address control unit.

FIG. 3 offers a circuit diagram for the column address control unit 200 shown in FIG. 2.

Referring to FIG. 3, the column address control unit 200 includes an inverter I1 for inverting the control signal all_bank_idle that is activated to the high level in the stand-by mode, a NAND gate ND1 receiving the output of the inverter I1 and the first internal clock clk; and an inverter I2 for inverting the output of the NAND gate ND1 to output the second internal clock clk_int.

FIG. 4 represents a truth table for operation of the column address control unit.

It will be described for the operation of the memory device of the embodiment with reference to FIG. 2 to FIG. 4.

As described above, in the operation states of the synchronous memory device, there are a data access state such as a refresh operation state, an active state, a read or write command state and a pre-charge state, a stand-by mode (the pre-charge operation has been performed) in which another command is waited for after the data access, and power-down mode. Further, there is an initial operation mode in which MRS setting and EMRS setting for initial operation of the memory device are performed. During the MRS setting and the EMRS setting, values that are required in the operation of the memory device (a CAS latency, a burst length and so on) are set.

In the memory device of the embodiment, the operation of the column-related blocks such as the column address control unit is stopped when a non-column command for which the column address is not used is performed. Here, stopping the operation of the column-related blocks can be achieved by stopping the input of the clock signal.

Here, there are the stand-by (the pre-charge operation has been performed) mode state, the active state, the initial setting state such as MRS setting and EMRS setting, and the refresh operation state in the non-column command for which the column address is not used.

In the power-down mode, the clock enable signal CKE is inputted in inactive state to the clock receiver 100 so as to make the clock receiver 100 not to output the internal clock. Accordingly, all the inner blocks are disabled.

When the clock enable signal CKE is inputted in active state, the power-down mode is released and the operation of the memory device is started. From then, the clock receiver 100 buffers the clock signal CK to output the first internal clock clk. After the power-down mode is released, the memory device enters the stand-by state, or the active state if an external active command is inputted immediately.

When the active command is inputted, a corresponding row address is inputted, which is received by the address receiver 410 and transferred to the address latch unit 420. The address latch unit 420 latches the row address in synchronous with the first internal clock clk. Then, the row address latch unit 420 receives the latched address RA3<0:13> to output the inner row address Row<0:13> for selecting a word line (not shown) of a memory cell array.

Then, the read or write command is inputted and a corresponding column address is inputted as the address signal A<0:13>. The inputted column address is transferred to the address latch unit 420 by the address receiver 410. The address latch unit 420 latches the column address in synchronous with the first internal clock clk.

On the other hand, the column address control unit 200 buffers the first internal clock clk to output the second internal clock clk_int.

Then, the column address control unit 300 receives and counts the latched column address CA<0:9> in synchronous with the second internal clock clk_int to output the inner column address Col<0:0>. The bit line (not shown) of the memory cell array is selected by the inner column address Col<0:9>. The unit cell that is to be accessed is determined by the word line that is selected by the inner row address Row<0:13> and the bit line that is selected by the inner column address Col<0:9>. In case of the read command, data in the determined unit cell is outputted to the external device. In case of the write command, data from the external device is stored in the determined unit cell.

On the other hand, in the stand-by mode, the clock receiver 100 outputs the first internal clock clk to the address latch unit and the column address control unit 200 receives the first internal clock clk without outputting the second clock signal clk_int.

Accordingly, the column address control unit 300 maintains in the inactive state because the second clock signal clk_int is not inputted.

In the operation of the column address control unit 200, even when the first internal clock clk is inputted to the NAND gate ND1, the output of the NAND gate stays in high because of the control signal all_bank_idle that is activated to the high level in the stand-by mode. Accordingly, the second internal clock clk_int maintains its state in low without regarding of the first internal clock clk.

The control signal all_bank_idle is inputted in the inactive state when the non-column command is performed. The truth table in FIG. 4 is for the operation of the column address control unit 200. For the disable state, when the control signal all_bank_idle is high, the second internal clock clk_int is outputted in the inactive state regardless of the first internal clock clk and, accordingly, the column address control unit 200 maintains in the inactive state during the non-column command operation.

For the stand-by operation during the non-column command operation, because the active signal is inputted after the stand-by operation, the row address-related blocks maintains in waiting but the column address-related blocks need not be in waiting.

Accordingly, the memory device of the embodiment makes the column address control unit disabled in the stand-by mode because the column address is inputted along with the read or write command only after the active signal is inputted. Further, because the column address is not required for the MRS setting or refresh operation, the memory device of the embodiment makes the column address-related blocks disabled.

As described above, the memory device of the embodiment can reduce unnecessary current consumption by disabling the column address control unit 300 in the non-column command operation.

Further, the memory device of the embodiment can reduce current consumption with the conventional blocks, by disabling the column address control unit 300 in the stand-by mode with control of the clock signal. The added column address control unit 200 of the embodiment can be implemented with 3 logics, which does not burden the circuit area significantly.

Figure 5:
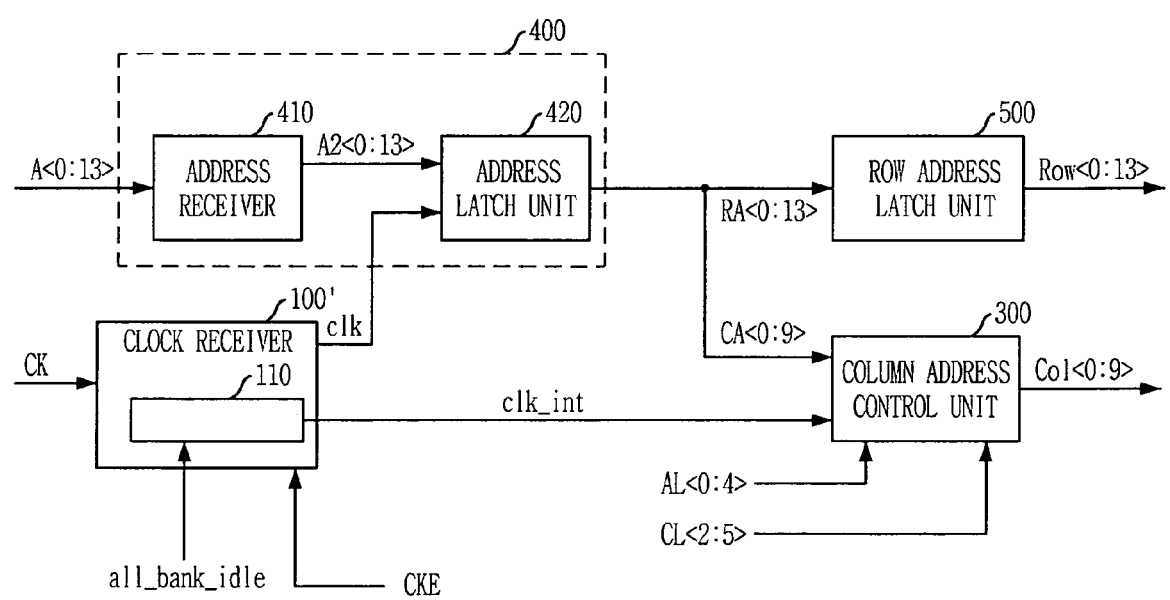
FIG. 5 illustrates a block diagram of a semiconductor memory device in accordance with a second preferred embodiment of the present invention.

FIG. 5 illustrates a block diagram of a semiconductor memory device in accordance with a second preferred embodiment of the present invention.

Referring to FIG. 5, the synchronous memory device of the second embodiment includes a clock receiver 100' for receiving an external clock CK to output a first internal clock clk and a second internal clock clk_int and stopping the output of the second internal clock clk_int in the stand-by mode; an address receiver 410 for receiving and transferring an address A<0:13>; an address latch unit 420 for latching an address A2<0:13> that is transferred by the address receiver 410, in synchronous with the first internal clock clk; a row address latch unit 500 for latching a row address RA<0:13> that is outputted from the address latch unit 420 to output inner row address Row<0:13>; a column address latch unit 300 activated in response to the second internal clock clk_int for counting a column address CA<0:9> that is outputted from the address latch unit 420 to output an inner column address Col<0:9>.

The memory device of the second embodiment is similar to the first embodiment except that the first internal clock clk and the second internal clock clk_int are outputted from the clock receiver 100' with no column address control unit. For the sake of simplicity, it will be omitted the detailed description for the operation of the memory device of the second embodiment.

As described above, the memory device of the present invention reduces unnecessary current consumption in the non-column command operation by stopping the operation of column address-related blocks when the non-column command is performed. With this reduction of current consumption in the non-column command operation, development of a low-power semiconductor memory device can be expedited.

Further, the present invention uses all the conventional blocks because the memory device significantly reduces current consumption in the non-column command operation just by controlling the clock signal so that developing period of the low-power semiconductor memory device can be accordingly reduced.

The present application contains subject matter related to the Korean patent application No. KR 2004-99905, filled in the Korean Patent Office on Dec. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a clock receiving means for receiving an external clock to output a first internal clock;
   an address latching means for receiving and latching an address in synchronous with the first internal clock;
   a row address latching means for latching a row address that is outputted from the address latching means;
   a clock signal controlling means for receiving the first internal clock to output a second internal clock and stopping the output of the second internal clock when a non-column command is performed; and
   a column address controlling means activated in response to the second internal clock for counting a column address that is outputted from the address latching means to output an inner column address.

2. The synchronous memory device as recited in claim 1, wherein the clock signal controlling means includes:
   a NAND gate receiving the first internal clock and a control signal that is activated when the non-column command is performed; and
   an inverter for inverting the output of the NAND gate to output the second internal clock.

3. The synchronous memory device as recited in claim 1, wherein the non-column command performing operation is one selected from the group consisting of a stand-by mode state (pre-charge operation has been performed), an active state, an initial setting state such as MRS and EMRS, and a refresh operation state.

4. A synchronous memory device comprising:
   a clock receiving means for receiving an external clock to output a first internal clock and a second internal clock and stopping the output of the second internal clock when a non-column command is performed;
   an address latching means for receiving and latching an address in synchronous with the first internal clock;
   a row address latching means for latching a row address that is outputted from the address latching means;
   a column address controlling means activated in response to the second internal clock for counting a column address that is outputted from the address latching means to output an inner column address.

5. The synchronous memory device as recited in claim 4, wherein the non-column command performing operation is one selected from the group consisting of a stand-by mode state (pre-charge operation has been performed), an active state, an initial setting state such as MRS and EMRS, and a refresh operation state.

* * * * *